United States Patent [19]
Aytur

[11] Patent Number: 6,013,958
[45] Date of Patent: Jan. 11, 2000

[54] INTEGRATED CIRCUIT WITH VARIABLE CAPACITOR

[75] Inventor: Turgut Sefket Aytur, Oakland, Calif.

[73] Assignee: Lucent Technologies Inc., Murray Hill, N.J.

[21] Appl. No.: 09/121,284

[22] Filed: Jul. 23, 1998

[51] Int. Cl.⁷ .............................. H02M 3/06; H03K 17/16
[52] U.S. Cl. .............................................. 307/109; 326/26
[58] Field of Search ................................. 307/108–110; 257/296, 298, 300, 312; 455/196.1, 197.1, 197.2; 326/27, 32, 26, 21; 235/132, 133; 360/39, 48

[56] References Cited

U.S. PATENT DOCUMENTS

| | | | |
|---|---|---|---|
| 4,499,387 | 2/1985 | Konishi | 326/15 |
| 4,602,222 | 7/1986 | Wynn | 331/179 |
| 4,716,313 | 12/1987 | Hori et al. | 326/80 |
| 5,283,631 | 2/1994 | Koerner et al. | 326/121 |
| 5,440,156 | 8/1995 | Shou et al. | 257/296 |
| 5,574,633 | 11/1996 | Prater | 363/59 |

OTHER PUBLICATIONS

Khorramabadi, H., et al. "Baseband Filters for IS–95 CDMA Receiver Applications Featuring Digital Automatic Frequency Tuning," *Digest of Technical Papers*, p. 172–173 (1996).

*Primary Examiner*—Jeffrey Gaffin
*Assistant Examiner*—Kim Huynh
*Attorney, Agent, or Firm*—John M. Harman

[57] ABSTRACT

Disclosed is an integrated circuit having a plurality of combinations of an integrated unit capacitor connected in series with a controlled channel of an integrated transistor switch. The series-connected capacitor and switch combinations are connected in parallel and the switches include a control gate coupled to a bit output of a register via a control line. In this manner, the capacitance of the variable capacitor depends on what word is stored in the register. Control gates for a different number of capacitor and switch combinations are connected to each bit output, and the numbers are weighted using, e.g., a binary weighting scheme. The variable capacitor is coupled to a balanced signal line pair, with capacitor and switch combinations comprising a switch connected between two capacitors that are connected to a line of the balanced signal line pair. Such arrangement is highly linear and even order distortion is reduced. The disclosed integrated circuit arrangements reduce the sensitivity to noise on the control line of the device. Variations in voltage applied to the control line and thus to the control gate of the switch vary the resistance value of the switch when closed, yet affect the value of the capacitive portion of the impedance very little. The disclosed capacitors are useful in circuits that need to be accurately trimmed once (e.g., filters) and in circuits in which variable capacitance is required, such as voltage controlled oscillators (VCOs).

5 Claims, 3 Drawing Sheets

INTEGRATED CIRCUIT WITH VARIABLE CAPACITOR

BACKGROUND OF THE INVENTION

1. Field of the Invention

The invention relates to integrated circuit devices. More particularly, the invention relates to variable capacitors within integrated circuits.

2. Description of the Related Art

Integrated circuits typically provide many performance advantages when compared with discrete designs. However, process parameter variation during manufacturing often results in frequency responses that differ significantly from design. Furthermore, certain discrete elements have proven to be difficult to integrate effectively into conventional complementary metal-oxide semiconductor (CMOS) technology.

An example of such an element is a varactor or varactor diode, which is an element whose capacitance varies with the voltage applied thereto. The varactor provides tuning control for devices such as LC-based voltage-controlled oscillators (VCOs). Common metrics for varactors include quality factor (Q) and tuning range, and most of these variable capacitance devices are purchased as discrete components.

However, to continue the drive toward integration, it is advantageous to have available variable capacitance elements such as varactor diodes that are capable of providing high-performance and are capable of being readily integrated into a common CMOS technology.

SUMMARY OF THE INVENTION

The invention is embodied in an integrated circuit including an integrated variable capacitor arrangement. Embodiments of the invention provide a plurality of combinations of an integrated unit capacitor connected in series with a controlled channel of an integrated transistor switch. The series-connected capacitor and switch combinations are connected in parallel, with the switches having a control gate line coupled to a bit output of a register via a control line. In this manner, the capacitance of the variable capacitor depends on what word is stored in the register.

According to embodiments of the invention, control gates for a different number of capacitor and switch combinations are connected to each bit output, and the numbers are weighted using, e.g., a binary weighting scheme or a unit weighting scheme. According to embodiments of the invention, the variable capacitor is coupled to a balanced signal line pair, with capacitor and switch combinations comprising a switch connected between two capacitors that are connected to a line of the balanced signal line pair. Nodes between the capacitors and the switch are connected to ground via respective resistors. Such arrangement is highly linear and even order distortion is reduced. Also, such arrangement provides an improved quality factor (Q).

According to an alternative embodiment of the invention, at least one variable capacitor is coupled to a balanced signal line pair in such a way that the capacitor and switch combinations include first and second branches containing a unit capacitor and a switch connected in series. The two branches are connected in parallel such that the capacitor is connected directly to a respective one of the line pair. In this arrangement, a greater range of variation in the capacitance is obtained between the switch being closed and the switch being open.

Integrated circuit arrangements according to embodiments of the invention reduce the sensitivity to noise on the control line of the device. Variations in voltage applied to the control line and thus to the control gate of the switch vary the resistance value of the switch when closed, yet affect the value of the capacitive portion of the impedance very little. Also, the nature of the process of making integrated circuits causes the capacitance of the individual unit capacitors to be consistent, improving the linearity of the capacitance. Capacitors according to embodiments of the invention are useful in circuits that need to be accurately trimmed once (e.g., filters) and in circuits in which variable capacitance is required, such as voltage controlled oscillators (VCOs).

BRIEF DESCRIPTION OF THE DRAWINGS

Embodiments of the invention will now be described with reference to the accompanying drawings, in which.

DETAILED DESCRIPTION

Figure 1:
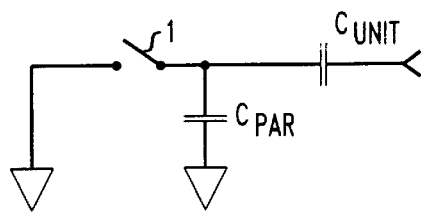
FIG. 1 is a schematic circuit diagram according to an embodiment of the invention.

In the following description similar components are referred to by the same reference numeral in order to enhance the understanding of the invention through the description of the drawings.

Although specific features, configurations and arrangements are discussed hereinbelow, it should be understood that such is done for illustrative purposes only. A person skilled in the relevant art will recognize that other configurations and arrangements are useful without departing from the spirit and scope of the invention.

Embodiments of the invention advantageously include an integrated variable capacitor comprising a plurality of combinations of an integrated unit capacitor connected in series with a controlled channel of an integrated transistor switch. The series-connected capacitor and switch combinations are connected in parallel, and the switches include a control gate coupled to a bit output of a register via a control line. In this manner, the capacitance of the variable capacitor depends on what word is stored in the register.

A digitally-tuned variable capacitor includes the combination of a unit capacitor in series with a switch. If this combination is a two port network or arrangement, then ideally the impedance (Z) is when the switch is open or "off", and $1/\omega C_{unit}$ when the switch is closed or "on", where $\omega$) is the frequency in radians per second and $C_{unit}$ is the capacitance of the capacitor/switch combination (i.e., the unit capacitance).

Using this combination, embodiments of the invention generate arrangements such as capacitor banks. Though certain applications may motivate different weighting schemes, an advantageous choice is binary weighting or unit weighting. For example, for an N bit control word, there are $2^N$ possible capacitor values. Specifically, the impedance is given as:

$$Z=1/j\omega MC_{unit},$$

where M represents the decoded binary word.

Deviations from such ideal behavior come primarily from two mechanisms: finite "on" resistance of the switch and parasitic capacitance from the switch and the unit capacitor. The finite "on" resistance affects the quality factor (Q) of the capacitor. The quality factor, which generally is defined as the magnitude of the reactance of the network divided by the resistance of the network, is given as:

$$Q_c=X_c/R_{on}=1/(\omega CR_{on}),$$

where $X_c$ is the reactance of the capacitor network, C is the capacitance of the capacitor and $R_{on}$ is the "on" resistance of the switch in the network.

FIG. 1 shows a single port representation of the non-ideal network or arrangement according to an embodiment of the invention. The arrangement includes a switch 1, a unit capacitance $C_{unit}$ and inherent parasitic capacitance $C_{par}$. The parasitic capacitance $C_{par}$ affects the ratio of the capacitance of the arrangement when the switch is closed or "on" to the capacitance of the arrangement when the switch is open or "off". Ideally, such ratio is infinite.

In operation, when switch 1 is closed ("on"), the arrangement presents the unit capacitance $C_{unit}$. However, when the switch 1 is open ("off"), the arrangement presents a capacitance defined as:

$$C=C_{par}C_{unit}/(C_{par}+C_{unit})=\text{nonzero}$$

The parasitic capacitance $C_{par}$ is generated from, e.g., the bottom plate of the unit capacitor and from the switch. With a metal-oxide semiconductor (MOS) device, a larger switch provides a lower resistance when the switch is closed or "on" and thus a higher capacitor quality factor (Q). However, a larger device also has increased parasitic capacitance $C_{par}$, which restricts the tuning range of the capacitor.

Figure 2:
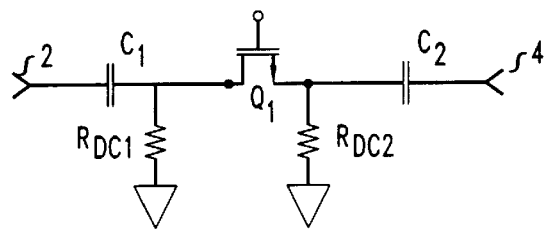
FIG. 2 is a schematic circuit diagram, suitable for high quality factor (Q) and high linearity applications, according to an alternative embodiment of the invention.

FIG. 2 shows a circuit diagram according to an embodiment of the invention of a switch/capacitor combination that is suited for applications requiring relatively high linearity and high Q. In this network or arrangement, unit capacitors $C_1$ and $C_2$ are connected between balanced inputs 2 and 4. A balanced input arrangement, in which the balanced input voltage or current is defined as the difference between the single-ended voltage or current applied at each input port, is one which the sum of the single-ended voltage or current applied at each port remains constant.

Also, in the network or arrangement shown in FIG. 2, the source-drain channel of a transistor $Q_1$, e.g., a metal-oxide semiconductor field-effect transistor (MOSFET), is connected between unit capacitors $C_1$ and $C_2$. Large resistors $R_{dc1}$ and $R_{dc2}$ set the DC potential of the source and drain to increase the overdrive voltage and reduce the "on" resistance of transistor Q1. The resistors are made large to prevent degradation of the capacitor quality factor (Q) of transistor Q1.

The topology of the arrangement shown in FIG. 2 is highly linear for at least two reasons. First, using a large transistor device with a low "on" resistance, such as transistor Q1, reduces voltage excursions across the MOS device. Second, if the arrangement is driven differentially, the even order distortion of the device and thus of the network is significantly reduced. However, the topology of the arrangement has a somewhat limited tuning range.

Figure 3:
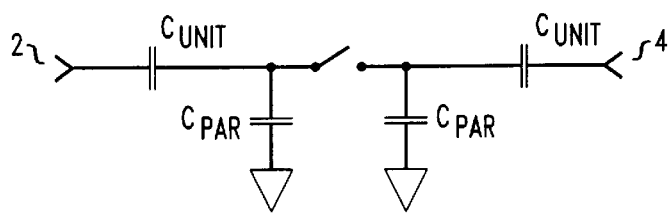
FIG. 3 is a theoretical representation of the schematic circuit diagram of FIG. 2 showing parasitic capacitance.

FIG. 3 shows a theoretically ideal representation of the arrangement of FIG. 2, i.e., the topology is shown with parasitic capacitance $C_{par}$. The ratio of the "on" capacitance of the arrangement to the "off" capacitance of the arrangement is shown to be:

$$\text{Ratio}=(C_{par}+C_{unit})/C_{par}$$

The quality factor (Q) of the arrangement shown in FIGS. 2–3 is higher than that of the arrangement in the single-capacitor, single-switch example of FIG. 1. In the topology of the arrangement of FIG. 3, the half-circuit equivalent splits the "on" resistance of the switch into two portions. Each portion is associated with the same reactance, thus increasing the quality factor (Q) by a factor of two.

Figure 4:
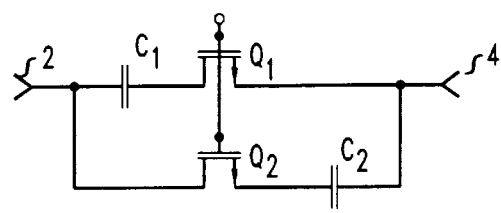
FIG. 4 is a schematic circuit diagram having a large tuning range according to another alternative embodiment of the invention.

FIG. 4 shows a circuit diagram according to an embodiment of the invention of a switch/capacitor combination suited for applications requiring broader tuning ranges but having less stringent linearity requirements that previously discussed arrangements. In this arrangement, capacitor $C_1$ is connected to the balanced input 2 and through MOSFET switch $Q_1$ to the balanced input 4. Capacitor $C_2$ is connected directly to the balanced input 4 and through a MOSFET switch $Q_2$ to the balanced input 2. The gates of MOSFETs $Q_1$ and $Q_2$ are connected in common. It should be noted that the inclusion of MOSFET switch $Q_2$ and capacitor $C_2$ are needed for maintaining the balanced line configuration.

Large resistors corresponding to those in the arrangement shown in FIG. 2 are not required in this arrangement but are useful, e.g., to prevent initial charge sharing during startup. Devices of the topology of the arrangement in FIG. 4 are DC coupled to the external network circuitry, therefore, care must be taken in designing the external network to increase or maximize the switch performance of the capacitor arrangement.

Figure 5:
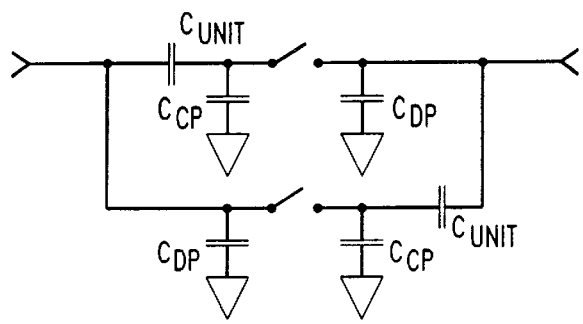
FIG. 5 is a theoretical representation of the schematic circuit diagram of FIG. 4 showing parasitic capacitance.

FIG. 5 shows a theoretically ideal representation of the arrangement of FIG. 4, i.e., the topology is shown with parasitic capacitance $C_{par}$. It should be noted that there is a distinction between the capacitor parasitic capacitance ($C_{cp}$) and device parasitic capacitance ($C_{dp}$).

The ratio of the "on" capacitance of the arrangement to the "off" capacitance of the arrangement is shown to be:

$$\frac{(2C_{unit}+C_{cp}+C_{dp})}{\frac{C_{unit}C_{cp}}{C_{unit}+C_{cp}}+C_{dp}}$$

It should be noted that, in the numerator, the term $2C_{unit}$ appears because the arrangement is a balanced line configuration. In the denominator, the term $C_{dp}$ appears separate because the device parasitic capacitance is no longer shielded by the unit capacitor (which is in contrast to the topology of the arrangement of FIG. 2). The quality factor (Q) of the arrangement remains the same as the single-capacitor, single-switch arrangement shown in FIG. 1.

Figure 6:
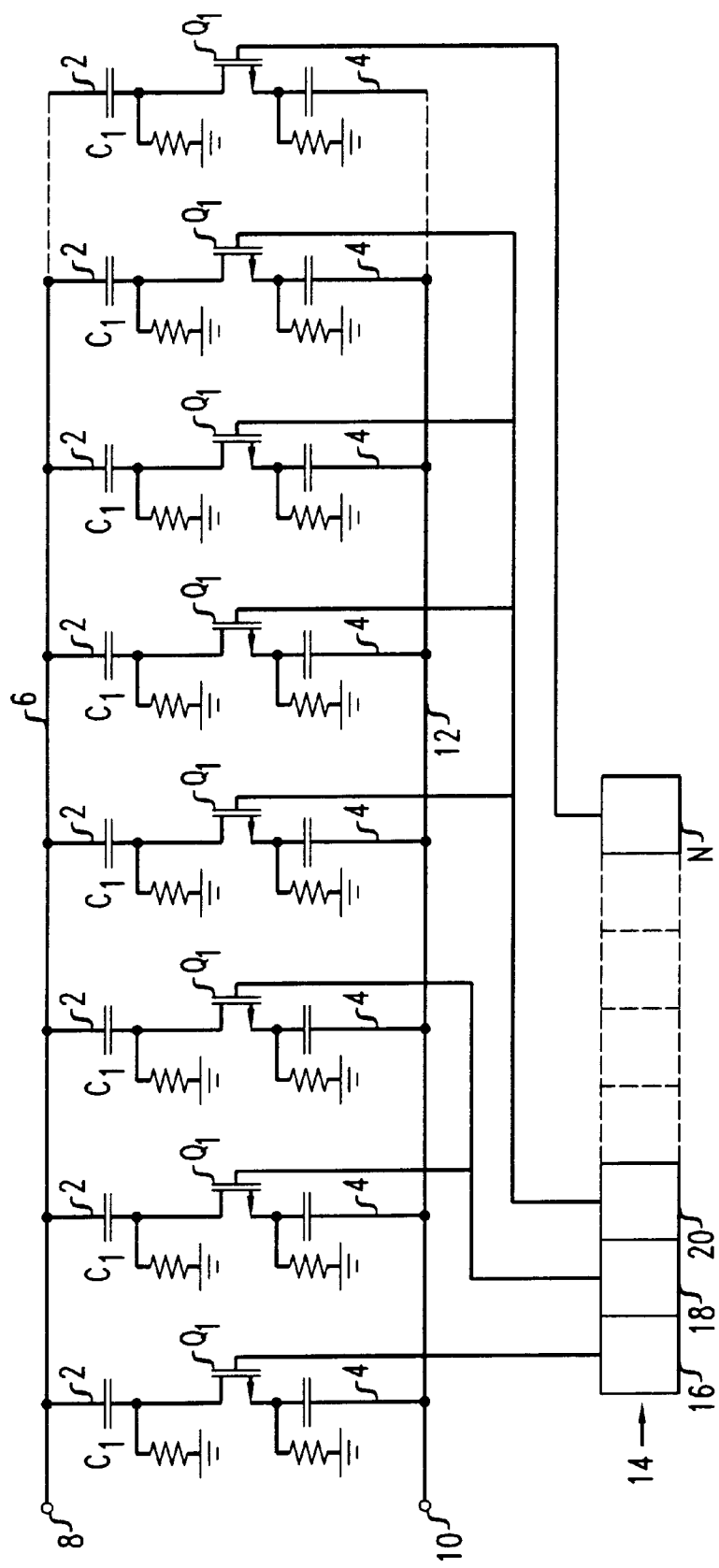
FIG. 6 is a schematic circuit diagram of a capacitor bank using capacitors having the schematic circuit diagram of FIG. 2.

FIG. 6 shows an integrated circuit according to an embodiment of the invention that contains a bank of capacitor/switch arrangements, e.g., a plurality of the unit capacitor/switch combination shown in the FIG. 2. According to this embodiment, the balanced inputs 2 are connected in parallel to one line 8 of a balanced signal line pair 8, 10. Also, the balanced inputs 4 are connected in parallel to the other line 10 of the balanced signal line pair 8, 10.

The gates of the transistor switches $Q_1$ are connected to outputs of a register 14 in binary weighted groups. For example, one gate is connected to output 16, two gates are connected to output 18, three gates are connected to output 20. The capacitance seen by the balanced line pair 8, 10 thus is controlled by the word stored in the register 14.

Figure 7:
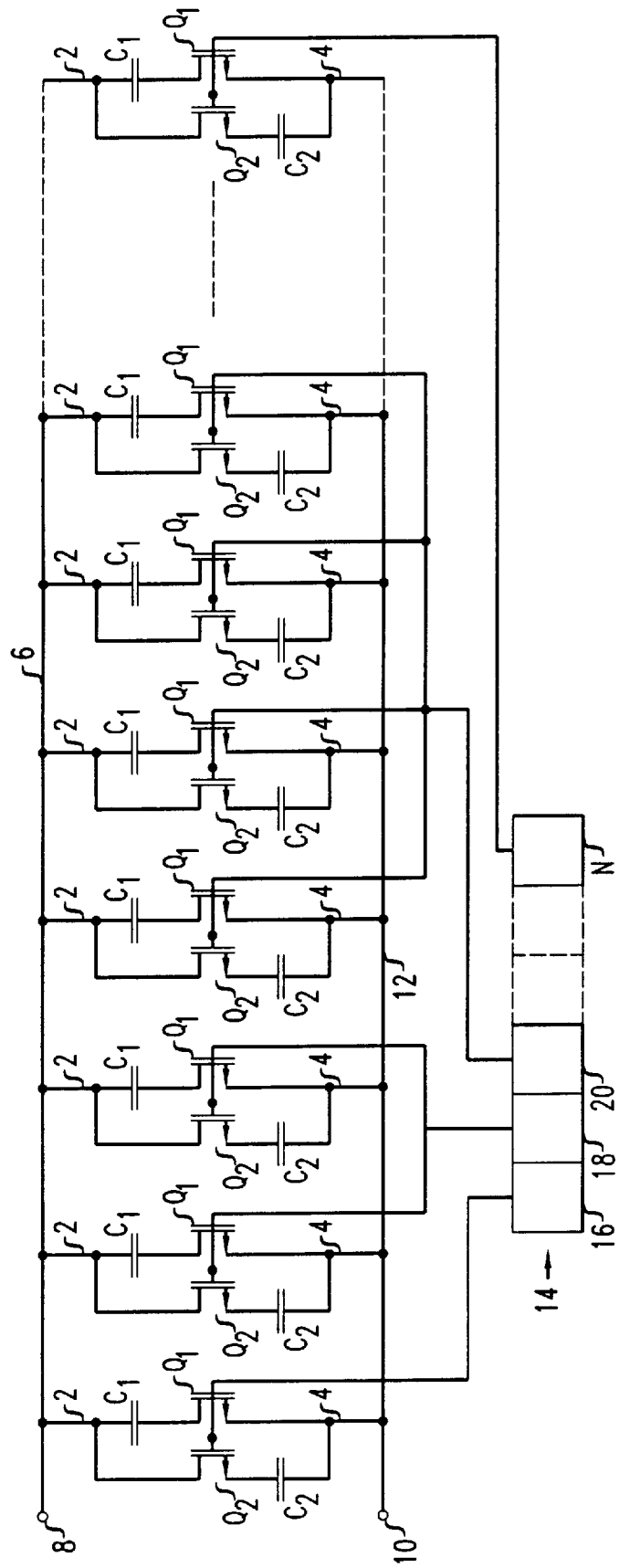
FIG. 7 is a schematic circuit diagram of a capacitor bank using capacitors having the schematic circuit diagram of FIG. 4.

FIG. 7 shows an integrated circuit according to an embodiment of the invention that contains a bank of capacitor/switch arrangements, e.g., a plurality of the unit capacitor/switch combination shown in FIG. 4. In this embodiment, the gates of the transistor switches Q1 and Q2 are connected to outputs of a register 14 in binary weighted groups, similar to the arrangement shown in FIG. 6. The capacitor bank arrangement shown in FIG. 7 is useful to tune the frequency response of any capacitor-based circuit. For example, it is possible to incorporate a digital, voltage-controlled oscillator (VCO) into this arrangement.

Depending on the required quality factor (Q) and the parasitic capacitance $C_{par}$ (of the bottom plate of the capacitor), the capacitor/switch arrangement shown in FIG. 4 (and FIG. 7) provides a decade or more of tuning range. Tunable filters typically are active designs that operate at lower frequencies and suffer from linearity problems. However, the digital capacitor bank shown in FIG. 3 (and FIG. 6) provides a tunable filter for high-frequency, high-linearity applications such as radio telephony.

In general, although the capacitance of the individual unit capacitors often are not very accurate in relation to the nominal capacitance, by the nature of the process of making integrated circuits the capacitance of the individual unit capacitors is consistent. Specifically, the incremental capacitance for a corresponding incremental register value represents a function with improved linearity. Arrangements according to embodiments of the invention are useful in circuits that typically need to be trimmed once, i.e., circuits whose component values need to be finely adjusted once (e.g., filters). Also, arrangements according to embodiments of the invention are useful in circuits in which variable capacitance typically is required, such as circuits containing voltage controlled oscillators (VCOs).

Circuit arrangements according to embodiments of the invention are useful for implementation using metal-oxide semiconductor (MOS) technology. For example, sub-micron MOS technology provides switches with low "on" resistance and reduced parasitic capacitance, thus allowing for tunable, variable capacitance capacitors with a quality factor (Q) of, e.g., approximately 50 at a frequency of approximately 900 Megahertz (MHz).

Integrated circuit arrangements according to embodiments of the invention reduce the sensitivity to noise on the control line of the device. Variations in voltage applied to the control line and thus to the control gate of the MOS switch vary the value of the "on" resistance of the MOS switch. These variations affect the value of the capacitive portion of the impedance very little.

For high quality factor (Q) implementations, a transmission zero will be located far from the operating frequency of the circuit. Variations in the transmission zero location only contribute to small variations in the phase response of the network and contribute virtually no variation to the magnitude response. This is in direct contrast to conventional implementations using varactor diodes, where variations in control voltage directly affect the location of the dominant poles which define the operating frequency. Thus, arrangements according to embodiments of the invention are advantageous for applications where large amounts of noise may be present on signal lines.

It will be apparent to those skilled in the art that many changes and substitutions can be made to the embodiments of the variable capacitor herein described without departing from the spirit and scope of the invention as defined by the appended claims and their full scope of equivalents.

What is claimed is:

1. An integrated circuit, for use in a balanced line configuration, said integrated circuit comprising:
    a plurality of combinations of an integrated unit capacitor connected in series with a controlled channel of an integrated transistor switch, the combinations being connected in parallel, wherein at least one of the transistor switches has a control gate coupled to a bit output of a register whereby the capacitance of the interconnect variable capacitor depends on what word is stored in the register, wherein the integrated unit capacitor in at least one of the combinations is coupled to a balanced signal line pair, and wherein at least one of the combinations comprises a transistor switch connected between two integrated unit capacitors connected to a line of said balanced signal line pair.

2. The integrated circuit as recited in claim 1, wherein control gates for a different number of combinations are connected to at least one of the bit outputs of the register.

3. The integrated circuit as recited in claim 2, wherein the numbers are weighted using a weighting scheme selected from the group consisting of binary weighting and unit weighting.

4. The integrated circuit as recited in claim 1, wherein nodes between the capacitor and the transistor switch are connected to ground via respective resistors.

5. The integrated circuit as recited in claim 1, wherein at least one combination comprises first and second branches containing an integrated unit capacitor and a transistor switch connected in series, the first and second branches being connected in parallel such that the integrated unit capacitor is connected directly to a respective one of said balanced signal line pair.

* * * * *